(12) United States Patent
Zhong et al.

(10) Patent No.: US 10,818,005 B2
(45) Date of Patent: Oct. 27, 2020

(54) PREVIOUS LAYER NUISANCE REDUCTION THROUGH OBLIQUE ILLUMINATION

(71) Applicant: KLA—Tencor Corporation, Milpitas, CA (US)

(72) Inventors: Jingshan Zhong, Shanghai (CN); Bjorn Brauer, Beaverton, OR (US); Lisheng Gao, Saratoga, CA (US)

(73) Assignee: KLA-Tencor Corp., Milpitas, CA (US)

( * ) Notice: Subject to any disclaimer, the term of this patent is extended or adjusted under 35 U.S.C. 154(b) by 63 days.

(21) Appl. No.: 16/293,599

(22) Filed: Mar. 5, 2019

(65) Prior Publication Data

US 2019/0279357 A1 Sep. 12, 2019

Related U.S. Application Data

(60) Provisional application No. 62/641,547, filed on Mar. 12, 2018.

(51) Int. Cl.
*G06T 7/00* (2017.01)
*G06F 30/398* (2020.01)

(52) U.S. Cl.
CPC .......... *G06T 7/0006* (2013.01); *G06F 30/398* (2020.01); *G06T 7/001* (2013.01); *G06T 2207/30148* (2013.01)

(58) Field of Classification Search
CPC combination set(s) only.
See application file for complete search history.

(56) References Cited

U.S. PATENT DOCUMENTS

| 7,570,796 B2 | 8/2009 | Zafar et al. |
| 7,623,229 B1 | 11/2009 | Vaez-Iravani et al. |
| 7,676,077 B2 | 3/2010 | Kulkarni et al. |
| 7,728,969 B2 | 6/2010 | Saito et al. |
| 8,126,255 B2 | 2/2012 | Bhaskar et al. |

(Continued)

FOREIGN PATENT DOCUMENTS

JP 2008-175653 7/2008

OTHER PUBLICATIONS

Hamamatsu et al., "Statistical Threshold Method for Semiconductor Inspection," 12th A-PCNDT 2006—Asia-Pacific Conference on NDT, Nov. 5-10, 2006, Auckland, New Zealand, 8 pages.
International Search Report and Written Opinion for PCT/US2019/021727 dated Jun. 18, 2019.

(Continued)

*Primary Examiner* — Cindy Trandai
(74) *Attorney, Agent, or Firm* — Ann Marie Mewherter

(57) ABSTRACT

Methods and systems for determining a layer on which a defect detected on a wafer is located are provided. One method includes detecting defects on a wafer by directing light to the wafer at first and second angles of incidence and determining locations of the defects on the wafer based on the output corresponding to the defects. For one of the defects detected in the output generated for one spot illuminated on the wafer with the light directed to the wafer at the first and second angles, the method includes comparing the locations of the one of the defects determined based on the output generated with the light directed to the one spot on the wafer at the first and second angles. The method further includes determining a layer of the wafer on which the one of the defects is located based on results of the comparing.

22 Claims, 4 Drawing Sheets

(56) References Cited

U.S. PATENT DOCUMENTS

| | | | |
|---|---|---|---|
| 9,222,895 B2 | 12/2015 | Duffy et al. | |
| 9,410,901 B2 | 8/2016 | Chuang et al. | |
| 10,458,924 B2* | 10/2019 | Kanai | G01N 21/956 |
| 2005/0122508 A1 | 6/2005 | Uto et al. | |
| 2006/0269120 A1 | 11/2006 | Nehmadi et al. | |
| 2008/0081385 A1 | 4/2008 | Marella et al. | |
| 2009/0123060 A1 | 5/2009 | Liu et al. | |
| 2014/0114597 A1* | 4/2014 | Chen | G06T 7/0004 |
| | | | 702/84 |
| 2014/0176545 A1* | 6/2014 | Laine | G06T 11/40 |
| | | | 345/424 |
| 2014/0268170 A1* | 9/2014 | Sun | G01N 21/9505 |
| | | | 356/498 |
| 2014/0300890 A1 | 10/2014 | Lange et al. | |
| 2016/0033420 A1 | 2/2016 | Baris et al. | |
| 2016/0116420 A1* | 4/2016 | Duffy | G03F 7/70625 |
| | | | 702/155 |
| 2016/0292840 A1 | 10/2016 | Konecky | |
| 2017/0047195 A1 | 2/2017 | Lee et al. | |
| 2017/0186151 A1* | 6/2017 | Banerjee | G06T 7/0006 |
| 2017/0200264 A1* | 7/2017 | Park | G06T 7/001 |
| 2019/0265600 A1* | 8/2019 | Chang | G03F 7/7005 |
| 2020/0167656 A1* | 5/2020 | Trenholm | G06N 3/084 |

OTHER PUBLICATIONS

Takahashi et al., "New Optical Measurement Technique for Si Wafer Surface Defects Using Annular Illumination with Crossed Nicols," Proceedings of the 17th American Society for Precision Engineer Annual Meeting, Jan. 2002, 6 pages.

\* cited by examiner

PREVIOUS LAYER NUISANCE REDUCTION THROUGH OBLIQUE ILLUMINATION

BACKGROUND OF THE INVENTION

1. Field of the Invention

This invention generally relates to methods and systems for previous layer nuisance reduction through oblique illumination. Certain embodiments relate to methods and systems for determining a layer on which a defect detected on a wafer is located.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

As design rules shrink, however, semiconductor manufacturing processes may ire operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

Separating nuisance defects from defects that a user cares about is therefore important for providing useful inspection results. One particularly problematic source of nuisance defects for optical inspection is defects detected originating on a layer other than the one being inspected. For example, a layer being inspected, a current layer, may be formed on top of one or more other layers. Those one or more underlying layers may have defects formed thereon or within those layers. Depending on the materials of the layers and the configuration of the inspection tool, the inspection tool may detect those defects underneath the current layer. Those prior layer defects may not, however, be of interest to a user. Instead, the user may only care about the current layer defects.

It is therefore important to accurately identify and separate current layer defects and prior layer defects. One way to perform prior layer defect reduction is to use one of several defect source analysis based techniques. For example, all defects that are detected on a layer prior to the inspection layer may be subtracted out based on their images and/or coordinates. Another option for separating current and prior layer defects is attribute based binning and/or tuning. Such binning and/or tuning may be performed when the patch images of the nuisance and the defects of interest (DOIs) look different from each other.

There are, however, a number of disadvantages to the currently available methods and systems. For example, for defect source analysis based techniques, a scan must be performed at a previous layer, which requires the wafer to be inspected at one additional inspection step, which might not be possible or might be too time consuming. In another example, in attribute based binning and/or tuning, such an approach will not work when patch images of DOI and nuisance look the same.

Accordingly, it would be advantageous to develop systems and/or methods for determining a layer on which a defect detected on a wafer is located that do not have one or more of the disadvantages described above.

SUMMARY OF THE INVENTION

The following description of various embodiments is not to be construed in any way as limiting the subject matter of the appended claims.

One embodiment relates to a system configured for determining a layer on which a defect detected on a wafer is located. The system includes an inspection system that includes at least an illumination subsystem and a detection subsystem. The illumination subsystem is configured to direct light to a wafer at first and second angles of incidence. The detection subsystem is configured to detect light from the wafer and to generate output responsive to the detected light. The system also includes one or more computer subsystems configured for detecting defects on the wafer by applying a defect detection method to the output generated by directing the light to the wafer at the first and second angles of incidence and determining locations of the defects on the wafer based on the output corresponding to the defects. For one of the defects detected in the output generated for one spot illuminated on the wafer with the light directed to the wafer at the first and second angles of incidence, the one or more computer subsystems are also configured for comparing the locations of the one of the defects determined based on the output generated with the light directed to the one spot on the wafer at the first and second angles of incidence. The one or more computer subsystems are further configured for determining a layer of the wafer on which the one of the defects is located based on results of the comparing. The system may be further configured as described herein.

Another embodiment relates to a computer-implemented method for determining a layer on which a defect detected on a wafer is located The method includes detecting defects on a wafer by applying a defect detection method to output generated by directing light to the wafer at first and second angles of incidence with an inspection subsystem configured as described above. The method also includes determining locations of the defects on the wafer based on the output corresponding to the defects. For one of the defects detected in the output generated for one spot illuminated on the wafer with the light directed to the wafer at the first and second angles of incidence, the method includes comparing the locations of the one of the defects determined based on the output generated with the light directed to the one spot on the wafer at the first and second angles of incidence. In addition, the method includes determining a layer of the wafer on which the one of the defects is located based on results of the comparing. The detecting, determining the locations, comparing, and determining the layer steps are performed by one or more computer subsystems coupled to the inspection subsystem.

Each of the steps of the method described above may be further performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for determining a layer on which a defect detected on a wafer is located. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

A further embodiment relates to a system configured for determining a layer on which a defect detected on a wafer is located. The system includes an inspection subsystem that includes at least an illumination subsystem and a detection subsystem. The illumination subsystem is configured to direct light to a wafer at an oblique angle of incidence. The detection subsystem is configured to detect light from the wafer and to generate output responsive to the detected light. The system also includes one or more computer subsystems configured for detecting defects on the wafer by applying a defect detection method to the output and determining locations of the defects in coordinates of a design for the wafer. For one of the defects, the one or more computer subsystems are configured for comparing the location of the one of the defects to locations of patterned features in a current layer of the design. The one or more computer subsystems are further configured for determining a layer of the wafer on which the one of the defects is located based on results of the comparing. The system may be further configured as described herein.

Another embodiment relates to a computer-implemented method for determining a layer on which a defect detected on a wafer is located The method includes detecting defects on a wafer by applying a defect detection method to output generated by directing light to the wafer an oblique of incidence with an inspection subsystem configured as described above. The method also includes determining locations of the defects in coordinates of a design for the wafer. For one of the defects, the method includes comparing the location of the one of the defects to locations of patterned features in a current layer of the design. In addition, the method includes determining a layer of the wafer on which the one of the defects is located based on results of the comparing. The detecting, determining the locations, comparing, and determining the layer steps are performed by one or more computer subsystems coupled to the inspection subsystem.

Each of the steps of the method described above may be further performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for determining a layer on which a defect detected on a wafer is located. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
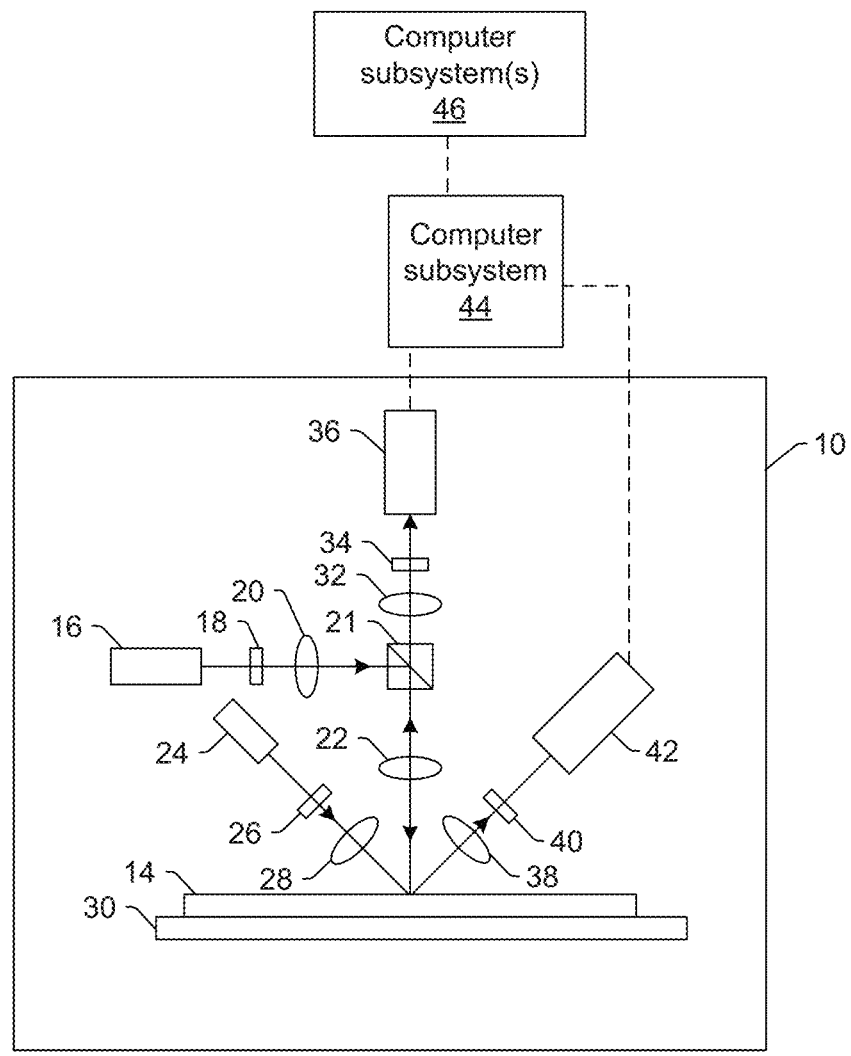
FIG. 1 is a schematic diagram illustrating a side view of an embodiment of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. Nos. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In general, however, the design information or data cannot be generated by imaging a wafer with a wafer inspection system. For example, the design patterns formed on the wafer may not accurately represent the design for the wafer and the wafer inspection system may not be capable of generating images of the design patterns formed on the wafer with sufficient resolution such that the images could be used to determine information about the design for the wafer. Therefore, in general, the design information or design data cannot be generated using a physical wafer. In addition, the "design" and "design data" described herein refers to information and data that is generated by a semiconductor device designer in a design process and is therefore available for use in the embodiments described herein well in advance of printing of the design on any physical wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured for previous layer nuisance reduction through oblique illumination. One embodiment relates to a system configured for determining a layer on which a defect detected on a wafer is located. One embodiment of such a system is shown in FIG. 1. The system includes an inspection subsystem that includes at least an illumination subsystem and a detection subsystem. The illumination subsystem is configured to direct light to a wafer at first and second angles of incidence, and the detection subsystem is configured to detect light from the wafer and to generate output responsive to the detected light. The wafer may include any wafer known in the art.

In the embodiment of the system shown in FIG. 1, inspection subsystem 10 includes an illumination subsystem configured to direct light to wafer 14. In the embodiment shown in FIG. 1, the illumination subsystem includes two illumination channels, one configured to direct light to the wafer at a first angle of incidence (AOI) and another configured to direct light to the wafer at a second AOI. In addition, as shown in FIG. 1, the first AOI is a normal AOI, and the second AOI is an oblique AOI.

Each of the illumination channels includes at least one light source. For example, as shown in FIG. 1, the first illumination channel includes light source 16. Light from light source 16 is directed through optical element 18 and then lens 20 to beam splitter 21, which directs the light to lens 22. Lens 22 directs the light to wafer 14 at a normal angle of incidence. The second illumination channel includes light source 24. Light from light source 24 is directed through optical element 26 and then lens 28, which directs the light to wafer 14 at an oblique AOI. In this manner, in one embodiment, the first AOI includes a normal AOI, and the second AOI includes an oblique AOI. The oblique AOI may include any suitable oblique AOI and may vary depending on, for example, the characteristics of the wafer.

The first and second AOIs may also include different ranges of AOIs. For example, the first AOI may include a range of AOIs or be included in a first range of AOIs, and the second AOI may include a different range of AOIs or be included in a second range of AOIs. The first and second ranges of AOIs may be discrete and mutually exclusive of each other. However, the different ranges of AOIs do not necessarily need to be mutually exclusive of each other.

The AOIs at which the light is directed to the wafer may be alterable, for example by changing the positions of one or more elements of one or more of the illumination channels and/or changing one or more parameters of one or more elements of the illumination subsystem. For example, in another embodiment, the first and second AOIs include different oblique AOIs. In one such embodiment, the parameters of the illumination channel that includes light source 16 may be altered so that it directs light to the wafer at an oblique AOI rather than a normal AOI as shown in FIG. 1. In another such embodiment, the illumination channel that includes light source 24 may be configured so that it directs light to the wafer at one oblique AOI at one time and another oblique AOI at another time.

The illumination subsystem may be configured to direct the light to the wafer at different AOIs at different times. For example, in one embodiment, the illumination subsystem is configured to direct the light to the wafer at a first AOI in a first scan of the wafer and to direct the light to the wafer at the second AOI in a second scan of the wafer. The first and second scans may be performed as described further herein. In one such embodiment, one of the illumination channels shown in FIG. 1 is used for the first scan, and the other of the illumination channels shown in FIG. 1 is used for the second scan. However, the same illumination channel may be used for the first and second scans with one or more parameters of the illumination channel altered between the scans to thereby change the AOI of the illumination channel.

In some instances, the inspection subsystem may be configured to direct light to the wafer at the first and second AOIs at the same time. For example, if light is directed to the wafer at different AOIs at the same time, one or more characteristics (e.g., wavelength, polarization, etc.) of the light directed to the wafer at different AOIs may be different such that light resulting from illumination of the wafer at the different AOIs can be discriminated from each other at the detector(s). In one such example, one of the illumination channels shown in FIG. 1 may be configured for illumination with a first range of wavelengths, and the other of the illumination channels may be configured for illumination with a second range of wavelengths different from the first. The different illumination channels may also or alternatively be configured for illumination with different polarizations.

In one embodiment, the first and second AOIs include different polar angles and the same one or more azimuthal angles. For example, the light may be directed to the wafer in the same plane of incidence and at different polar angles and/or centered in the same plane of incidence and at different polar angles. In the embodiment shown in FIG. 1, the two illumination channels may be configured to direct light to the wafer in the same plane of incidence, which is the plane of the paper. The light directed to the wafer at the first and second AOI may also have be directed to the wafer at the same one azimuthal angle and/or at the same range of azimuthal angles. In any case, the different AOIs may be different only in polar angle to thereby simplify the steps performed as described herein for defects detected on the wafer (although the different AOIs do not necessarily need to have the same azimuthal angle(s)).

In another embodiment, a plane of incidence of the light directed to the wafer at the first and second AOIs is oriented at an angle between 0 degrees and 180 degrees with respect to patterned features on the wafer. For example, the plane of the incoming light does not have to be oriented perpendicular to patterned features, e.g., trench like structures, on the wafer but could be in any direction (from 0 to 180 degrees).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the wafer at a different AOI. Alternatively, the illumination subsystem may include only one illumination channel, and the illumination channel may be configured to direct the light to the wafer at different AOIs at different times (e.g., by changing one or more parameters of the illumination channel between scans of the wafer). The illumination subsystem may have any other suitable configuration known in the art for directing light having different or the same characteristics to the wafer at different angles of incidence sequentially or simultaneously.

In one embodiment, light source 16 and/or light source 24 may include a broadband plasma (BBP) light source. In this manner, the light generated by the light sources and directed to the wafer may include broadband light. However, the light sources may include any other suitable light sources such as a laser, which may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light sources may also include polychromatic light sources that generates light at multiple discrete wavelengths or wavebands. Light sources 16 and 24 may also include different types of light sources and/or light sources having the same or different configurations.

Optical elements 18 and 26 may include any suitable optical elements such as polarizing components, spectral filters, spatial filters, reflective optical elements, apodizers, apertures, and the like, which may include any such suitable optical elements known in the art. Optical elements 18 and 26 may be different types of optical elements and/or may have the same or different configurations. Although lenses 20, 22, and 26 are shown in FIG. 1 as single refractive optical elements, it is to be understood that, in practice, each of lenses 20, 22, and 26 may include a number of refractive and/or reflective optical elements that in combination focus the light from the optical element to the wafer. Beam splitter 21 may include any suitable beam splitter known in the art. The illumination subsystem shown in FIG. 1 and described herein may include any other suitable optical elements (not shown). In addition, the system may be configured to alter one or more of the elements of the illumination subsystem based on the type of illumination to be used for inspection.

The inspection subsystem may also include a scanning subsystem configured to cause the light to be scanned over the wafer. For example, the inspection subsystem may include stage 30 on which wafer 14 is disposed during inspection. The scanning subsystem may include any suitable mechanical and/or robotic assembly (that includes stage 30) that can be configured to move the wafer such that the light can be scanned over the wafer. In addition, or alternatively, the inspection subsystem may be configured such that one or more optical elements of the inspection subsystem perform some scanning of the light over the wafer. The light may be scanned over the wafer in any suitable fashion.

The detection subsystem includes one or more detection channels. Each of the one or more detection channels includes a detector configured to detect light from the wafer due to illumination of the wafer and to generate output responsive to the detected light. For example, the detection subsystem shown in FIG. 1 includes two detection channels, one formed by collector 32, element 34, and detector 36 and another formed by collector 38, element 40, and detector 42. As shown in FIG. 1, the two detection channels are configured to collect and detect light at different angles of collection.

In one embodiment, the light detected by the detection subsystem due to the light directed to the wafer at the first and second AOIs includes specularly reflected light. For example, in some instances, both detection channels are configured to detect specularly reflected light. For example, the detection channel that includes detector 36 may be configured to detect specularly reflected light caused by illumination at the normal AOI, and the detection channel that includes detector 42 may be configured to detect specularly reflected light caused by illumination at the oblique AOI. In a similar manner, one of the detection channels may be configured to detect light caused by illumination at one oblique AOI, and the other detection channel may be configured to detect light caused by illumination at a different oblique AOI. In this manner, different detection channels may be configured to detect light caused by illumination at different AOIs regardless of what those AOIs are. In another embodiment, both of the detection channels may be configured to detect light scattered from the wafer due to the illumination of the wafer with the different AOIs, respectively.

Although FIG. 1 shows an embodiment of the inspection subsystem that includes two detection channels, the inspection subsystem may include a different number of detection channels (e.g., only one detection channel or two or more detection channels). For example, one detection channel may be configured to detect light caused by illumination at one AOI in a first scan and then to detect light caused by illumination at another AOI in a second scan. Although each of the collectors are shown in FIG. 1 as single refractive optical elements, it is to be understood that each of the collectors may include one or more refractive optical elements) and/or one or more reflective optical element(s). Elements 24 and 40 may include any suitable optical elements such as polarizing components, spectral filters, spatial filters, reflective optical elements, apertures, and the like, which may include any such suitable optical elements known in the art. Elements 24 and 40 may include different types of elements and/or may have the same or different configurations.

Detectors 36 and 42 may include different types of detectors and/or may have the same or different configurations. The detectors may include photo-multiplier tubes (PMTs), charge coupled devices (CCDs), time delay integration (TDI) cameras, or any other suitable detectors known in the art. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the inspection subsystem may be signals or data, but not image signals or image data. In such instances, a computer subsystem such as computer subsystem 44 of the system may be configured to generate images of the wafer from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 28xx and 29xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Computer subsystem 44 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the wafer. Computer subsystem 44 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 44 may be coupled to computer subsystem(s) 46 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

As noted above, the inspection subsystem is configured for directing light to and/or scanning light over a physical version of the wafer thereby generating actual (i.e., not simulated) output and/or images for the physical version of the wafer. In this manner, the inspection subsystem may be configured as an "actual" tool, rather than a "virtual" tool. Computer subsystem(s) 46 shown in FIG. 1 may, however, include one or more "virtual" systems (not shown) that are configured for performing one or more functions using at least some of the actual optical images and/or the actual electron beam images generated for the wafer, which may include any of the one or more functions described further herein.

The one or more virtual systems are not capable of having the wafer disposed therein. In particular, the virtual system(s) are not part of inspection subsystem 10 and do not have any capability for handling the physical version of the wafer. In other words, in a system configured as a virtual system, the output of its one or more "detectors" may be output that was previously generated by one or more detectors of an actual inspection subsystem and that is stored in the virtual system, and during the "imaging and/or scanning," the virtual system may replay the stored output as though the wafer is being imaged and/or scanned. In this manner, imaging and/or scanning the wafer with a virtual system may appear to be the same as though a physical wafer is being imaged and/or scanned with an actual system, while, in reality, the "imaging and/or scanning" involves simply replaying output for the wafer in the same manner as the wafer may be imaged and/or scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

The computer subsystem(s) are configured for detecting defects on the wafer by applying a defect detection method to the output generated by directing the light to the wafer at the first and second AOIs. Detecting defects on the wafer may be performed in any suitable manner known in the art (e.g., applying a defect detection threshold to the output and determining that any output having a value above the threshold corresponds to a defect or a potential defect) with any suitable defect detection method and/or algorithm.

The method also includes determining locations of the defects based on the output corresponding to the defects. As described further herein, the locations of the detected defects may be determined in a number of different ways. In one embodiment, the locations of the detected defects are determined with sub-pixel accuracy. "Sub-pixel" as that term is used herein is generally defined as smaller than a pixel of output generated by an inspection subsystem. In this manner, "sub-pixel accuracy" as that term is used herein can be generally defined as the determination of something (e.g. a defect location) with an error smaller than the size (distance from one side to the other) of a single pixel in the image acquired by the inspection subsystem. The defect location determinations described further herein enable the defect locations to be determined with sub-pixel accuracy. For example, an interpolation of the point spread function of a defect can be performed as described further herein to thereby determine the defect location with sub-pixel accuracy.

In one embodiment, determining the locations includes interpolation of the locations of the defects within the output. Interpolation may be performed to upsample the output corresponding to the defects (e.g., a portion of a difference image, which may be generated as described herein) onto a grid of pixels that is finer than a grid of pixels in the output and using a location of a center of a pixel in the finer grid of pixels with the strongest signal as the location of the defect. These steps may be performed in any suitable manner known in the art. The interpolation may also be performed in any other suitable manner known in the art.

In some embodiments, determining the locations includes interpolation of the locations of the defects within the output and alignment of the output to design information for the wafer. For example, interpolating the location of each defect as good as possible may be performed using the latest align to design methods and systems that are commercially available from KLA-Tensor and defect location interpolation techniques. In addition, layer information in the design information for the wafer may be used to align the design substantially accurately to the optical patch images generated by the inspection subsystem. Once the design is aligned to the optical images, the defect coordinates extracted from the optical patch images are overlaid with the design. In this manner, highly accurate coordinates for the defects in design space (i.e., "design coordinates") can be determined aid can then be correlated to layer structures as described further herein.

Aligning the output (e.g., images) to the design information may be performed in a number of different manners. For example, in some embodiments, the aligning includes maximizing a cross-correlation between the output and the design information. In one such example, upon inspection, the measured images may be aligned to the design information by maximizing the cross-correlation between the images and the design information. The cross-correlation that is used in the aligning may include any suitable cross-correlation known in the art such as a normalized cross-correlation. Aligning the output for the detected defects to the design information for the wafer may also be performed as described in the above-incorporated patent to Kulkarni. The embodiments described herein may be configured to perform any of the aligning described in this patent.

In another embodiment, detecting the defects includes generating difference images for different portions of the output by subtracting reference output for the different portions from the different portions of the output and applying the defect detection method to the difference images, and determining the locations of the detected defects is performed by fitting a portion of the difference images corresponding to the detected defects to a function. The reference output may be acquired in any suitable manner. In one example, the reference output may be output generated for a corresponding location on the wafer. In a particular example, the different portions of the output may include output generated for different areas in a die on the wafer, and the reference output may include output generated for corresponding areas in a different die on the wafer. Generating the difference images may include aligning the reference output and corresponding portions of the output and then subtracting the reference output from the corresponding portions of the output, which may be performed in any suitable manner. The defect detection method may be applied to the difference images as described further herein.

The function to which the portion of the difference images is fit may be one of several possible functions. In general, a parabolic fit of the point spread function of the defects may be used to interpolate the defect locations. One could also use higher order polynomials, but they are computationally more expensive. For example, the function may be a Gaussian function. In such an example, the measured signal in the difference image corresponding to a detected defect can be fitted to the expected signal profile (e.g., a Gaussian profile) for the detected defect. In other words, the computer subsystem(s) may fit for the defect location using a Gaussian model. For some modes of the inspection subsystem and for defects with irregular signal profiles, the defect locations could be determined by fitting to simulations of these signal profiles. In another example, determining the locations of the detected defects is performed by fitting a portion of the difference images corresponding to the defects to an Airy disc function. For example, functions that can be used to describe the defect profiles may include functions that can be described analytically (e.g., Airy discs or polynomials) or functions derived from measurements (e.g., a set of defects are measured and their profiles are averaged together). The model or function used for the expected signal profiles of the inspection subsystem may include any suitable such model or function known in the art having any suitable format known in the art. In addition, the fitting of the portion of the difference image to the model for the signal profiles may be performed in any suitable manner.

For one of the defects detected in the output generated for one spot illuminated on the wafer with the light directed to the wafer at the first and second AOIs, the one or more computer subsystems are configured for comparing the locations of the one of the defects determined based on the output generated with the light directed to the one spot on the wafer at the first and second AOIs and determining a layer of the wafer on which the one of the defects is located based on results of the comparing. In one embodiment, determining the layer includes determining that the layer is a current layer if the results of the comparing indicate that the locations of the one of the defects are the same and determining that the layer is a prior layer if the results of the comparing indicate that the locations of the one of the defects are different. For example, to distinguish between defects located at the top versus the bottom of a certain layer, the projected defect location is compared between normal and oblique illumination of the incoming light. If the defect location of these two illumination angles is occurring at the same location, the defect is most likely originating from the current layer and if it occurs at different locations, it should be from the previous layer.

Figure 2:
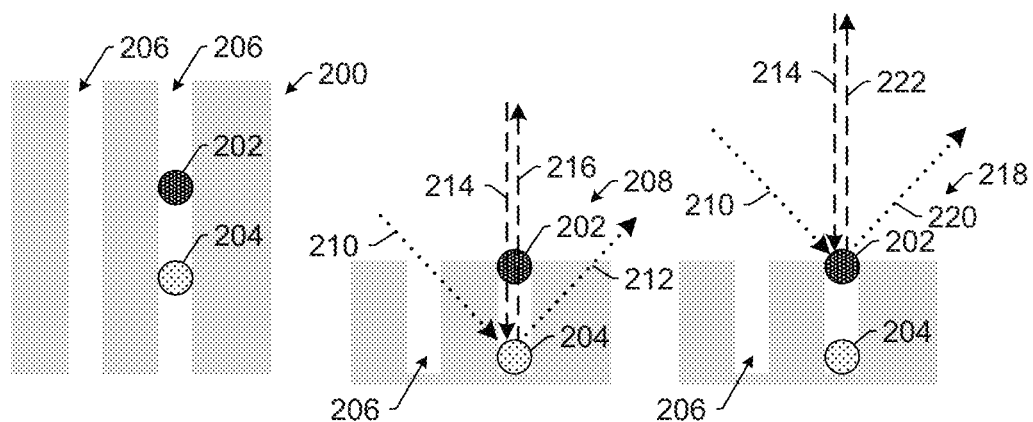
FIG. 2 is a schematic diagram illustrating a plan view of an one example of a prior layer defect and a current layer defect on a wafer, a side view of the different defects with light directed to and reflected from the prior layer defect, and a side view of the different defects with light directed to and reflected from the current layer defect.
Figure 3:
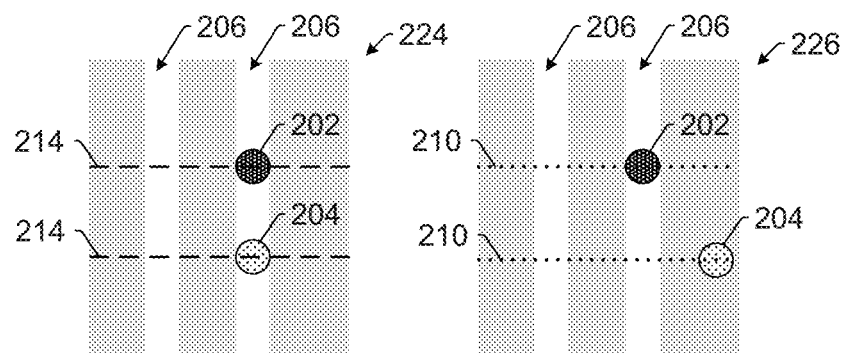
FIG. 3 is a schematic diagram illustrating plan views of defect locations determined according to an embodiment described herein for the prior layer defect and the current layer defect of FIG. 2 with different angles of incidence.

FIGS. 2 and 3 illustrate different defects and their defect locations determined with different AOIs to determine which layer the defects are located on. For example, as shown in plan view 200, defects 202 and 204 are located at different positions within one of two trenches 206 formed on a wafer. As shown in cross-sectional view 208, defect 202 is located at the top of the trench and is therefore a current layer defect while defect 204 is located at the bottom of the trench and is therefore a prior layer defect. In this manner, defect 202 may be a DOI while defect 204 may be a nuisance defect.

During scanning of the wafer with the inspection subsystem, both of the defects may be illuminated with light directed to the wafer at multiple AOIs and light from the defects due to the illumination with both of the AOIs may be detected by the inspection subsystem. For example, as shown in cross-sectional view 208, defect 204 may be illuminated with tight 210 at an oblique AOI which may produce specularly reflected light 212. In addition, as shown in cross-sectional view 208, defect 204 may be illuminated with light 214 at a normal AOI which may produce specularly reflected light 216. In a similar manner, as shown in cross-sectional view 218, defect 202 may be illuminated with tight 210 at an oblique AOI which may produce specularly reflected light 220. In addition, as shown in cross-sectional view 208, defect 202 may be illuminated with light 214 at a normal AOI which may produce specularly reflected light 222. The defects may be imaged with any two illumination angles described herein and in any manner described herein.

Plan views 224 and 226 shown in FIG. 3 illustrate the differences in the defect locations of defects 202 and 204 when determined based on light detected using different AOIs. For example, the defect locations in plan view 224 were determined based on normal AOI light 214 while the defect locations in plan view 226 were determined based on oblique AOI light 216. As shown by way of comparison of plan views 224 and 226, the locations of defect 202 determined using both AOIs are the same. In contrast, the locations of defect 204 determined using both AOIs are different. Since the locations of defect 202 are determined to be the same, this defect will be determined to be a current layer defect. Since the locations of defect 204 are determined to be different, this defect will be determined to be a prior layer defect.

Using inspection/image collection under an oblique illumination angle combined with normal illumination for separating prior layer defects from current layer defects is believed to be a new feature of the embodiments described herein. In addition, inspection/image collection under any two illuminations which will cause a shift of the DOI and nuisance defect locations is believed to be a new feature of the embodiments described herein. For example, two oblique illumination angles can be used in the embodiments described herein.

In one embodiment, the computer subsystem(s) are configured for determining if the one of the defects is a nuisance defect based on the layer determined for the one of the defects. "Nuisance defects" as that term is used herein is generally defined as defects that are detected on the wafer as such but are not defects that a user cares about. In some embodiments, the nuisance defects include nuisance defects that are not visible to an electron beam based tool. For example, the embodiments described herein can be used to identify a source of nuisance defects when they are not visible to a scanning electron microscope (SEM) review tool in the current layer. In particular, in general, a SEM is not able to detect defects that are below the uppermost surface of the wafer due to the nature of the SEM itself (the electrons either do not penetrate the uppermost surface or are not returned from under the uppermost surface in a manner that renders them detectable). As such, a SEM is not able to detect and analyze nuisance defects that are below the uppermost surface on the wafer. In contrast, some optical inspection systems are able to detect defects below the uppermost surface of the wafer. Such defect detection may be advantageous or disadvantageous depending on the goals of inspection. In some cases, the detection of defects below the uppermost surface of the wafer may be unavoidable even when it is not desired. However, such defects may essentially be nuisance defects in that the user does not care about them and/or they are not DOI for the inspection in which they are detected.

In one such embodiment, the computer subsystem(s) are configured for determining that the one of the defects is a nuisance defect if the layer is determined to be the prior layer.

Figure 4:
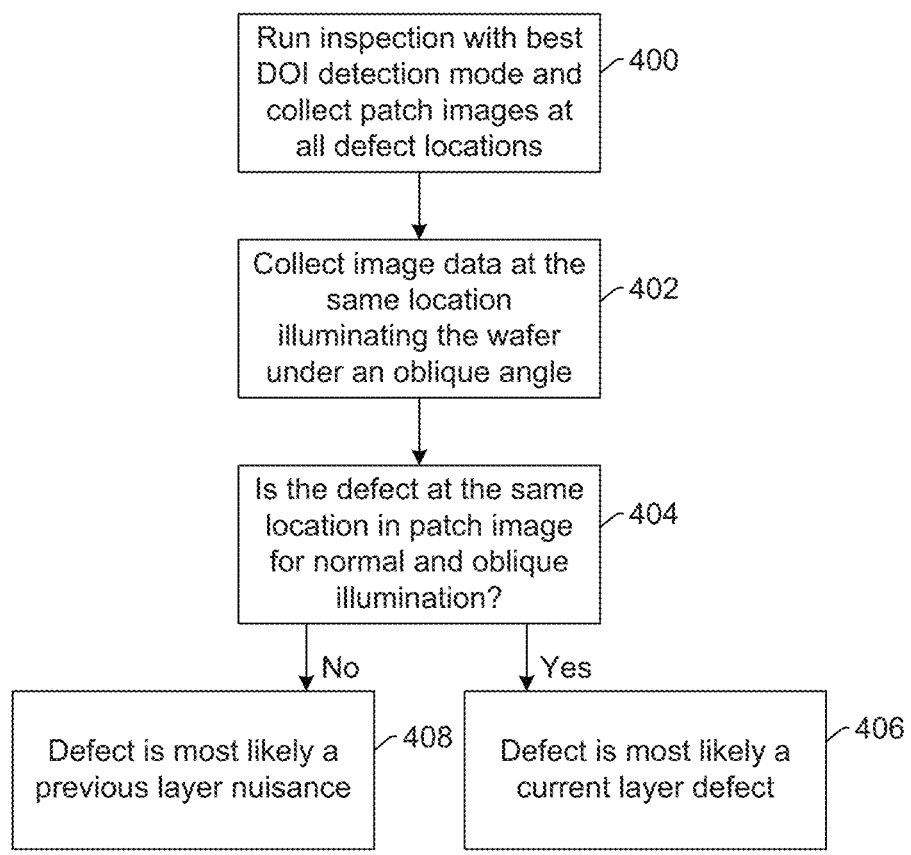
FIGS. 4 and 5 are flow diagrams illustrating embodiments of methods for determining a layer on which a defect detected on a wafer is located.

As described further above, the illumination subsystem may be configured to direct light to the wafer at different AOIs in different scans of the wafer. In one such embodiment, the second scan of the wafer includes generating the output responsive to the detected light only at the locations of the defects detected using the output generated in the first scan. One example of such an embodiment is shown in FIG. 4. In particular, as shown in FIG. 4, in step 400, the computer subsystem(s) may run an inspection with the best DOI detection mode and collect patch images at all defect locations. In step 402, the computer subsystem(s) may collect image data at the same location illuminating the wafer under an oblique angle. As shown in step 404, the computer subsystem(s) may determine if the defect is at the same location in patch image for normal and oblique illumination. If the defect is determined to be at the same location in patch image for normal and oblique illumination, the computer subsystem(s) may determine in step 406 that the defect is most likely a current layer defect. If the defect is not determined to be at the same location in patch image for normal and oblique illumination, the computer subsystem(s) may determine in step 408 that the defect is most likely a previous layer nuisance.

The embodiments described herein have a number of advantages over other methods and systems for separating prior layer defects from current layer defects. For example, in the embodiments described herein, previous layer nuisance can be differentiated from current layer DOI thereby improving sensitivity of the inspection recipe. In addition, the embodiments described herein advantageously reduce inspection time since the previous layer does not need to be scanned.

Each of the embodiments of the system may be further configured according to any other embodiment(s) described herein.

Another embodiment relates to a computer-implemented method for determining a layer on which a defect detected on a wafer is located. The method includes steps for each of the functions of the computer subsystem(s) described above. The inspection subsystem is configured as described herein.

Each of the steps of the method may be performed as described further herein. The method may also include any other step(s) that can be performed by the inspection subsystem, computer subsystem(s), and/or system(s) described herein. The steps of the method are performed by one or more computer subsystems, which may be configured according to any of the embodiments described herein. In addition, the method described above may be performed by any of the system embodiments described herein.

A further embodiment relates to another system configured for determining a layer on which a defect detected on a wafer is located. This system includes an inspection subsystem that includes at least an illumination subsystem and a detection subsystem. The illumination subsystem is configured to direct light to a wafer at an oblique angle of incidence. The detection subsystem is configured to detect light from the wafer and to generate output responsive to the detected light. This inspection subsystem may be configured as shown in FIG. 1. However, in this embodiment, the inspection subsystem may only include one illumination channel configured to direct light to the wafer at an oblique AOI. This illumination channel may be the illumination channel that includes light source 24. In addition, the detection subsystem included in this inspection subsystem may only include one detection channel, for example, the detection channel that includes detector 42. This inspection subsystem may be further configured as described herein and shown in FIG. 1. For example, in one embodiment, the detected light includes specularly reflected light. The inspection subsystem may be configured to detect specularly reflected light as described further herein.

This system also includes one or more computer subsystems, which may be configured as computer subsystem 44 and/or computer subsystem(s) 36 shown in FIG. 1. The one or more computer subsystems are configured for detecting defects on the wafer by applying a defect detection method to the output, which may be performed as described further herein. The computer subsystem(s) are also configured for determining locations of the defects in coordinates of a design for the wafer, which may be performed as described further herein. In one embodiment, determining the locations includes interpolation of the locations of the defects within the output, which may be performed as described further herein. In another embodiment, determining the locations includes interpolation of the locations of the defects within the output, and the comparing includes alignment of the output to design information for the wafer, which may be performed as described herein. Projecting defect locations collected at an oblique illumination angle into design space is believed to be a new feature of the embodiments described herein.

For one of the defects, the computer subsystem(s) are configured for comparing the location of the one of the defects to locations of patterned features in a current layer of the design. For example, if determining the locations of the defects includes design based alignment, which may be performed as described herein, the defect locations can be accurately determined in design space, which helps to find out from which layer the defect is coming from.

The computer subsystem(s) are further configured for determining a layer of the wafer on which the one of the defects is located based on results of the comparing.

In one embodiment, the computer subsystem(s) are configured for determining if the one of the defects is a nuisance defect based on the layer determined for the one of the defects, which may be performed as described further herein. In another embodiment, determining the layer includes determining that the layer is the current layer if the results of the comparing indicate that the location of the one of the defects is within the locations of the patterned features in the current layer. In one such embodiment, the computer subsystem(s) are configured for determining that the one of the defects is a nuisance defect if the one of the defects is not determined to be located on the current layer, which may be performed as described further herein.

Figure 5:
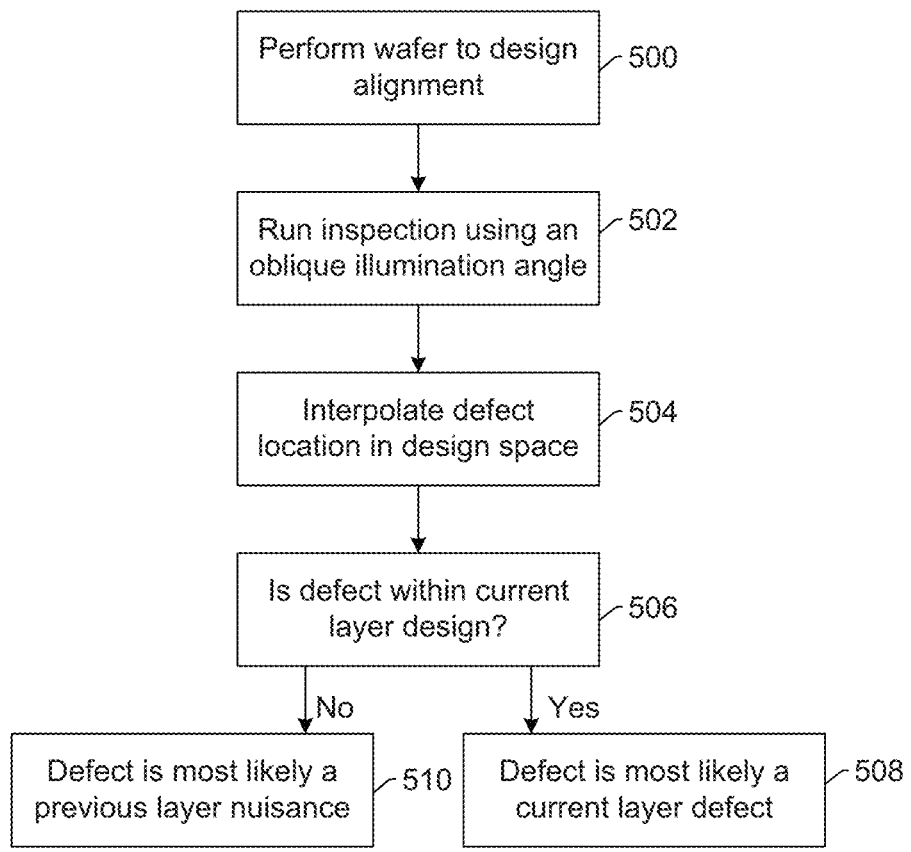

One example of such an embodiment is shown in FIG. 5. For example, as shown in step 500 of FIG. 5, the computer subsystem(s) may perform wafer to design alignment. In step 502, the computer subsystem(s) may run inspection using an oblique illumination angle. In step 504, the computer subsystem(s) may interpolate defect location in design space. In step 506, the computer subsystem(s) may determine if the defect is within the current layer design. If the defect is determined to be within the current layer design, the computer subsystem(s) may determine that the defect is most likely a current layer defect in step 508. If the defect is determined to not be within the current layer design, then the computer subsystem(s) may determine that the defect is most likely a previous layer nuisance as shown in step 510.

These embodiments also have the same advantages over other methods and systems for separating prior layer defects from current layer defects described above. Each of the embodiments of the system may be further configured according to any other embodiment(s) described herein.

Another embodiment relates to a computer-implemented method for determining a layer on which a defect detected on a wafer is located. The method includes steps for each of the functions of the computer subsystem(s) described above. The inspection subsystem is configured as described herein.

Each of the steps of the method may be performed as described further herein. The method may also include any other step(s) that can be performed by the inspection subsystem, computer subsystem(s), and/or system(s) described herein. The steps of the method are performed by one or more computer subsystems, which may be configured according to any of the embodiments described herein. In addition, the method described above may be performed by any of the system embodiments described herein.

Figure 6:
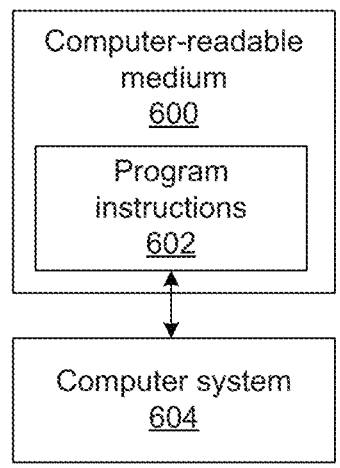
FIG. 6 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for determining a layer on which a defect detected on a wafer is located. One such embodiment is shown in FIG. 6. In particular, as shown in FIG. 6, non-transitory computer-readable medium 600 includes program instructions 602 executable on computer system 604. The computer-implemented method may include any step(s) of any method(s) described herein.

Program instructions 602 implementing methods such as those described herein may be stored on computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC", SSE (Streaming SIMD Extension) or other technologies or methodologies, as desired.

Computer system 604 may be configured according to any of the embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Further modifications and alternative embodiments of various aspects of the invention will be apparent to those skilled in the art in view of this description. For example, methods and systems for determining a layer on which a defect detected on a wafer is located are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for determining a layer on which a defect detected on a wafer is located, comprising:
    an inspection subsystem comprising at least an illumination subsystem and a detection subsystem, wherein the illumination subsystem is configured to direct light to a wafer at first and second angles of incidence, and wherein the detection subsystem is configured to detect light from the wafer and to generate output responsive to the detected light; and
    one or more computer subsystems configured for:
        detecting defects on the wafer by applying a defect detection method to the output generated by directing the light to the wafer at the first and second angles of incidence;
        determining locations of the defects on the wafer based on the output corresponding to the defects;
        for one of the defects detected in the output generated for one spot illuminated on the wafer with the light directed to the wafer at the first and second angles of incidence, comparing the locations of the one of the defects determined based on the output generated with the light directed to the one spot on the wafer at the first and second angles of incidence; and
        determining a layer of the wafer on which the one of the defects is located based on results of said comparing.

2. The system of claim 1, wherein the one or more computer subsystems are further configured for determining if the one of the defects is a nuisance defect based on the layer determined for the one of the defects.

3. The system of claim 1, wherein determining the layer comprises determining that the layer is a current layer if the results of the comparing indicate that the locations of the one of the defects are the same and determining that the layer is a prior layer if the results of the comparing indicate that the locations of the one of the defects are different.

4. The system of claim 3, wherein the one or more computer subsystems are further configured for determining that the one of the defects is a nuisance defect if the layer is determined to be the prior layer.

5. The system of claim 1, wherein determining the locations comprises interpolation of the locations of the defects within the output.

6. The system of claim 1, wherein determining the locations comprises interpolation of the locations of the defects within the output and alignment of the output to design information for the wafer.

7. The system of claim 1, wherein the light detected by the detection subsystem due to the light directed to the wafer at the first and second angles of incidence comprises specularly reflected light.

8. The system of claim 1, wherein the first angle of incidence comprises a normal angle of incidence, and wherein the second angle of incidence comprises an oblique angle of incidence.

9. The system of claim 1, wherein the first and second angles of incidence comprise different oblique angles of incidence.

10. The system of claim 1, wherein the first and second angles of incidence comprise different polar angles and the same one or more azimuthal angles.

11. The system of claim 1, wherein a plane of incidence of the light directed to the wafer at the first and second angles of incidence is oriented at an angle between 0 degrees and 180 degrees with respect to patterned features on the wafer.

12. The system of claim 1, wherein the illumination subsystem is further configured to direct the light to the wafer at the first angle of incidence in a first scan of the wafer and to direct the light to the wafer at the second angle of incidence in a second scan of the wafer.

13. The system of claim 12, wherein the second scan of the wafer comprises generating the output responsive to the detected light only at the locations of the defects detected using the output generated in the first scan.

14. A non-transitory computer-readable medium, storing program instructions executable on a computer system for performing a computer-implemented method for determining a layer on which a defect detected on a wafer is located, wherein the computer-implemented method comprises:
    detecting defects on a wafer by applying a defect detection method to output generated by directing light to the wafer at first and second angles of incidence with an inspection subsystem comprising at least an illumination subsystem and a detection subsystem, wherein the illumination subsystem is configured to direct the light to the wafer at the first and second angles of incidence, and wherein the detection subsystem is configured to detect light from the wafer and to generate the output responsive to the detected light;
    determining locations of the defects on the wafer based on the output corresponding to the defects;
    for one of the defects detected in the output generated for one spot illuminated on the wafer with the light directed to the wafer at the first and second angles of incidence, comparing the locations of the one of the defects determined based on the output generated with the light directed to the one spot on the wafer at the first and second angles of incidence; and
    determining a layer of the wafer on which one of the defects is located based on results of said comparing.

15. A computer-implemented method for determining layer on which a defect detected on a wafer is located, comprising:
    detecting defects on a wafer by applying a defect detection method to output generated by directing light to the wafer at first and second angles of incidence with an inspection subsystem comprising at least an illumination subsystem and a detection subsystem, wherein the illumination subsystem is configured to direct the light to the wafer at the first and second angles of incidence, and wherein the detection subsystem is configured to detect light from the wafer and to generate the output responsive to the detected light;

determining locations of the defects on the wafer based on the output corresponding to the defects;

for one of the defects detected in the output generated for one spot illuminated on the wafer with the light directed to the wafer at the first and second angles of incidence, comparing the locations of the one of the defects determined based on the output generated with the light directed to the one spot on the wafer at the first and second angles of incidence; and determining a layer of the wafer on which the one of the defects is located based on results of said comparing.

16. A system configured for determining a layer on which a defect detected on a wafer is located, comprising:

an inspection subsystem comprising at least an illumination subsystem and a detection subsystem, wherein the illumination subsystem is configured to direct light to a wafer at an oblique angle of incidence, and wherein the detection subsystem is configured to detect light from the wafer and to generate output responsive to the detected light; and one or more computer subsystems configured for:
detecting defects on the wafer by applying a defect detection method to the output;
determining locations of the defects in coordinates of a design for the wafer;
for one of the defects, comparing the location of the one of the defects to locations of patterned features in a current layer of the design; and
determining a layer of the wafer on which the one of the defects is located based on results of said comparing.

17. The system of claim 16, wherein the one or more computer subsystems are further configured for determining if the one of the defects is a nuisance defect based on the layer determined for the one of the defects.

18. The system of claim 16, wherein determining the layer comprises determining that the layer is the current layer if the results of the comparing indicate that the location of the one of the defects is within the locations of the patterned features in the current layer.

19. The system of claim 18, wherein the one or more computer subsystems are further configured for determining that the one of the defects is a nuisance defect if the one of the defects is not determined to be located on the current layer.

20. The system of claim 16, wherein determining the locations comprises is interpolation of the locations of the defects within the output.

21. The system of claim 16, wherein determining the locations comprises interpolation of the locations of the defects within the output, and wherein the comparing comprises alignment of the output to design information for the wafer.

22. The system of claim 16, wherein the detected light comprises specularly reflected light.

* * * * *